(12) United States Patent
Yang et al.

(10) Patent No.: US 6,927,145 B1
(45) Date of Patent: Aug. 9, 2005

(54) BITLINE HARD MASK SPACER FLOW FOR MEMORY CELL SCALING

(75) Inventors: Jean Y. Yang, Sunnyvale, CA (US); Mark T. Ramsbey, Sunnyvale, CA (US); Jaeyong Park, Sunnyvale, CA (US); Tazrien Kamal, San Jose, CA (US); Emmanuil H. Lingunis, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 10/770,673

(22) Filed: Feb. 2, 2004

(51) Int. Cl.[7] .................. H01L 21/761; H01L 21/027
(52) U.S. Cl. ............................... 438/420; 438/526
(58) Field of Search ................ 438/257, 261, 438/262, 263, 264, 266, 280, 287, 288, 414, 438/420, 526

(56) References Cited

U.S. PATENT DOCUMENTS

| 5,168,334 | A | | 12/1992 | Mitchell et al. ............ 257/324 |
|---|---|---|---|---|
| 5,349,221 | A | | 9/1994 | Shimoji .................... 257/324 |
| 5,418,176 | A | * | 5/1995 | Yang et al. ................. 438/262 |
| 5,966,603 | A | | 10/1999 | Eitan ........................ 438/258 |
| 6,037,227 | A | * | 3/2000 | Hong ........................ 438/276 |
| 6,077,746 | A | * | 6/2000 | You et al. .................. 438/276 |
| 6,403,420 | B1 | | 6/2002 | Yang et al. ................. 438/261 |
| 6,524,913 | B1 | * | 2/2003 | Lin et al. ................... 438/261 |
| 6,531,361 | B1 | * | 3/2003 | Liu et al. ................... 438/257 |
| 6,706,595 | B2 | | 3/2004 | Yang et al. ................. 438/258 |
| 2002/0063277 | A1 | | 5/2002 | Ramsbey et al. ........... 257/316 |
| 2002/0098676 | A1 | | 7/2002 | Ning et al. ................. 438/622 |

FOREIGN PATENT DOCUMENTS

WO 99/60631 11/1999

OTHER PUBLICATIONS

Nalamasu et al., "Invited Paper: Extending Resolution Limits of IC Fabrication Technology: Demonstration by Device Fabrication and Circuit Performance", Jan. 2001, Fourteenth International Conference on VLSI Design, p. 469.*
Rothschild et al., "193-nm Lithograpy", Sep. 1995, IEEE Journal of Selected Topics in Quantum Electronics, pp. 916-923.*
Claims from U.S. Appl. No. 10/770,245, filed Feb. 02, 2004.

* cited by examiner

*Primary Examiner*—Evan Pert
(74) *Attorney, Agent, or Firm*—Renner, Otto, Boisselle & Sklar, LLP (57) ABSTRACT

The invention is a semiconductor device and a method of forming the semiconductor device. The semiconductor device comprises a substrate; buried bitlines formed in the substrate narrower than achievable at a resolution limit of lithography; a doped region formed adjacent at least one of the buried bitlines; a charge trapping layer disposed over the substrate; and a conductive layer disposed over the charge trapping layer, wherein the doped region adjacent the least one of the buried bitlines inhibits a leakage current between the buried bitlines.

17 Claims, 7 Drawing Sheets

BITLINE HARD MASK SPACER FLOW FOR MEMORY CELL SCALING

TECHNICAL FIELD

The present invention generally relates to arrayed semiconductor devices. Specifically, the present invention relates to the use of a disposable hard mask with spacers for memory bitline scaling in non-volatile memory devices.

BACKGROUND ART

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phones, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell has been developed, i.e., "MirrorBit®" Flash memory. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multiplayer storage layer, referred to as a "charge-trapping dielectric layer", is formed over the semiconductor substrate. The charge-trapping dielectric layer can generally be composed of three separate layers: a tunneling layer, a charge-trapping layer, and a second insulating layer. Wordlines are formed over the charge-trapping dielectric layer perpendicular in the bitlines. Programming circuitry controls two bits per cell by applying a signal to the wordline, which acts as a control date, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

The SONOS type memory devices can be formed in the following manner. In Mitchell et al., U.S. Pat. No. 5,168,334, EEPROM memory cells are formed with buried bitlines. The buried bitlines and bitline oxides are formed in the core region of the substrate prior to formation of the ONO dielectric. Alternatively, Mitchell et al. forms EEPROM memory cells by forming an ONO dielectric, depositing polysilicon over the ONO dielectric, patterning the polysilicon, forming the buried bitlines, and removing the ONO dielectric covering the bitlines. In Eitan, U.S. Pat. No. 5,966,603, after an ONO dielectric is formed over the substrate, a bitline mask is patterned over the ONO dielectric in the core while completely covering the periphery. Portions of the top oxide and nitride layers left exposed by the bitline mask are etched/removed. The bitlines are implanted, and then the bitline oxides are formed over the bitlines. In Eitan et al., PCT International Publication No. WO 99/60631, memory cells are formed by forming an ONO dielectric over the substrate. Next, a bitline mask with openings for the bitlines is formed over the ONO dielectric. Then, the top oxide and nitride layers left exposed by the bitline mask are etched/removed. The bitlines are implanted, the bitline mask is removed, the exposed portions of the bottom oxide of the ONO dielectric are removed, gate oxides are grown, including thick oxide growth over the bitlines, and polysilicon gates and wordlines are formed.

The SONOS type FLASH memory cell structure has been described as a two-transistor cell or two-bit per cell memory device. If a multi-level is used, then four or more bits per cell can be accomplished. Multi-bit cells enable SONOS type memory devices to have the advantage over others in facilitating the continuing trend of increasing the amount of information held/processed on an integrated circuit chip. Additionally, the manufacture of both floating gate FLASH memory type devices and SONOS type memory devices continue to scale the floating gate FLASH memory cells and the SONOS type FLASH memory cells in order to increase the number of devices formed on a chip that forms an integrated circuit. Given the continuing trend towards miniaturization and increased integration of devices on an integrated circuit chip, efficient utilization of space is of increasing importance.

Unfortunately, as the channel size is decreased, there is potential for the semiconductor device to be affected by the short channel effect. The short channel effect is a decrease in the effective channel length, often represented as $L_{\it eff}$. Decreasing the effective channel length can result in an undesirable off-state current passing between the buried bitlines, much like the off-state current in the MOS transistors. Thus, the undesirable current passing between the buried bitlines limits the further scaling of non-volatile memory devices.

Additionally, in the manufacture of semiconductor devices, there are multiple high temperature cycles (thermal cycles) that may adversely increase off-state leakage current by increasing diffusion of the buried bitlines and reducing the effective channel length.

Therefore, there is a strong need in the art for non-volatile memory devices with buried bitlines that inhibit the off-state leakage current between the buried bitlines. Additionally, there is a need in the art for buried bitlines that allow further scaling of non-volatile memory devices. Further, there is a need to produce such devices by a process which decreases the number of manufacturing steps. Further still, there is a need to produce such devices with increased control of the dimensions of the bitlines and/or the means for inhibiting the off-state leakage current between the buried bitlines. Further, there is a need to apply such buried bitlines to other arrays of semiconductor devices.

DISCLOSURE OF INVENTION

According to one aspect of the invention, the invention is a method of manufacturing a semiconductor device, the method comprising the steps of: forming a charge trapping layer over a substrate; forming a hard mask with openings of a width dimension less than achievable at a resolution limit of lithography; forming buried bitlines in the substrate; and forming a doped region adjacent to at least one of the buried bitlines, wherein the doped region adjacent the at least one of the buried bitlines inhibits a leakage current between the buried bitlines.

According to another aspect of the invention, the invention is a semiconductor device, comprising: a substrate; buried bitlines formed in the substrate narrower than achievable at a resolution limit of lithography; a doped region formed adjacent at least one of the buried bitlines; a charge trapping layer disposed over the substrate; and a conductive layer disposed over the charge trapping layer, wherein the doped region adjacent the least one of the buried bitlines inhibits a leakage current between the buried bitlines.

BRIEF DESCRIPTION OF DRAWINGS

These and further features of the present invention will be apparent with reference to the following description and drawings, wherein.

To illustrate the present invention in a clear and concise manner, the drawings may not necessarily be to scale and certain features may be shown in a partial schematic format. Additionally, in the detailed description that follows, identical components have been given the same reference numerals. Further, similar components in different embodiments will have a similar reference numeral incremented by 100. For example, in a first embodiment, a dielectric layer is assigned reference number 18. Subsequent embodiments may use reference numbers 18, 318, 418, etc., for the dielectric layer of subsequent embodiments, although the dielectric layer may have a different configuration or a different function in the different embodiments. For the sake of brevity, in-depth descriptions of similar components may be omitted from descriptions of subsequent embodiments.

MODE(S) FOR CARRYING OUT THE INVENTION

Figure 1:
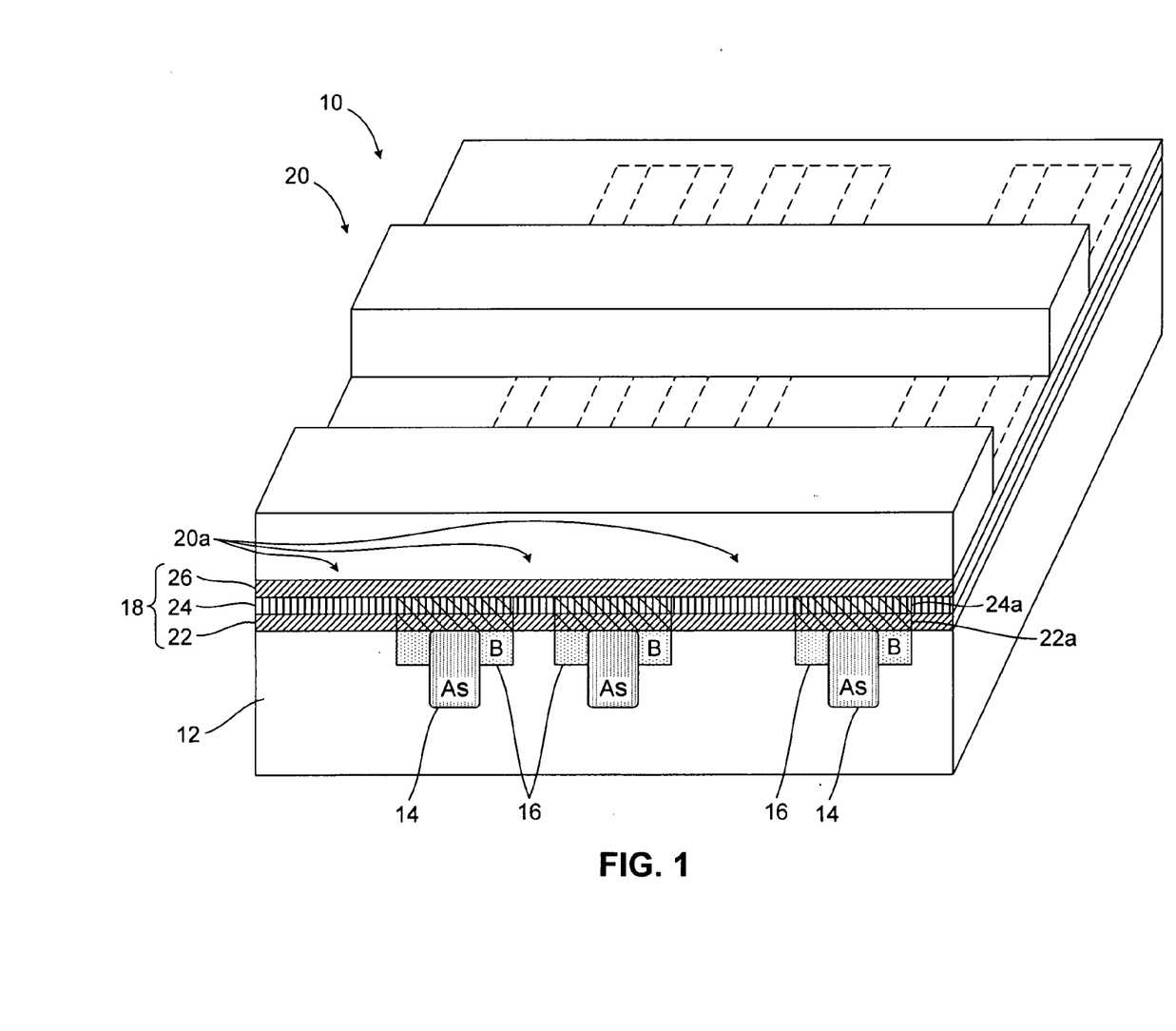
FIG. 1 illustrates a perspective view of a semiconductor device, including doped regions of a first dopant type adjacent buried bitlines of a second dopant type, in accordance with the present invention.
Figure 2:
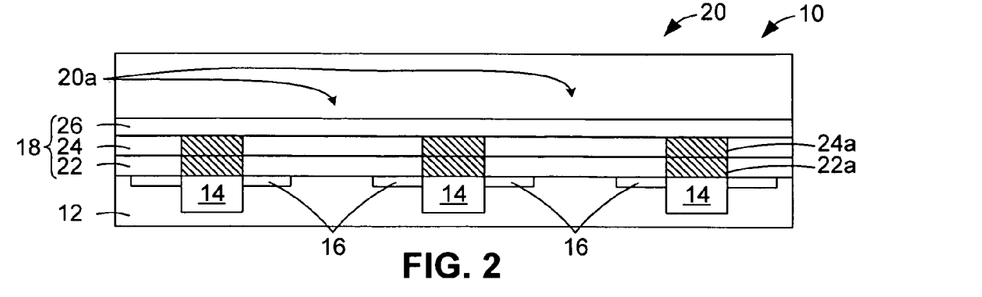
FIG. 2 is a schematic cross-sectional view of the semiconductor device of FIG. 1 in accordance with the present invention.

Referring initially to FIGS. 1 and 2, a structure of the present invention is shown, generally designated as 10. For illustrative purposes, the structure 10 will be described below in relationship to a non-volatile memory device, including a charge trapping non-conducting layer and buried bitlines. The structure 10 may also be referred to herein as the semiconductor device 10. Those having ordinary skill in the art will appreciate that the invention applies to other semiconductor devices that include buried bitlines, e.g., a floating gate FLASH memory device with buried bitlines, as further described below.

The semiconductor device 10 includes a semiconductor substrate 12 with buried bitlines 14 and doped regions 16 adjacent the buried bitlines 14 formed therein. A dielectric layer 18 is formed over the semiconductor substrate 12. The dielectric layer 18 is interposed between a conductive layer 20 and the semiconductor substrate 12. The conductive layer 20 is patterned so as to form wordlines, including individual gate electrodes 20a as will be further described below.

As illustrated in FIGS. 1 and 2, the dielectric layer 18 may comprise multiple layers. The multiple layers of the dielectric layer 18 may include a tunneling layer 22, a charge trapping layer 24 and an insulating layer 26. The tunneling layer 22 is interposed between the charge trapping layer 24 and the semiconductor substrate 12. The charge trapping layer 24 is interposed between the insulating layer 26 and the tunneling layer 22. The insulating layer 26 is formed over the charge trapping layer 24. Portions of the dielectric layer 18 may be implanted during the formation of the semiconductor device 10. Implanted portions of the tunneling layer 22 and the charge trapping layer 24 are illustrated in FIG. 1 with a cross hatch and labeled, 22a and 24a, respectively. Over the insulating layer 26, the conductive layer 20, including the gate electrodes 20a, is formed.

The semiconductor device 10 may be divided into two regions (not shown). For example, the semiconductor device 10 may to be divided into a core region and a periphery region. The core region may contain memory cells and the periphery region may contain the remaining portions of the chip, such as, the controlling logic and input/output devices.

The doped regions 16 adjacent the buried bitlines 14 inhibit the undesirable increase in the off-state leakage current between buried bitlines 14 due to the lateral diffusion of the buried bitlines 14 caused by the thermal cycles used in the manufacture of the semiconductor device 10. Further, the doped regions 16 adjacent the buried bitlines 14 decrease the undesirable current between bitlines 14 due to the reduction in the physical dimension of the channel length. The following described method(s) are particularly useful for forming such a semiconductor device 10.

Figure 10:
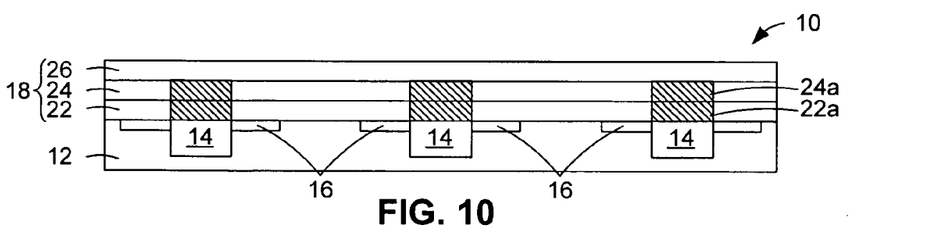
Figure 11:
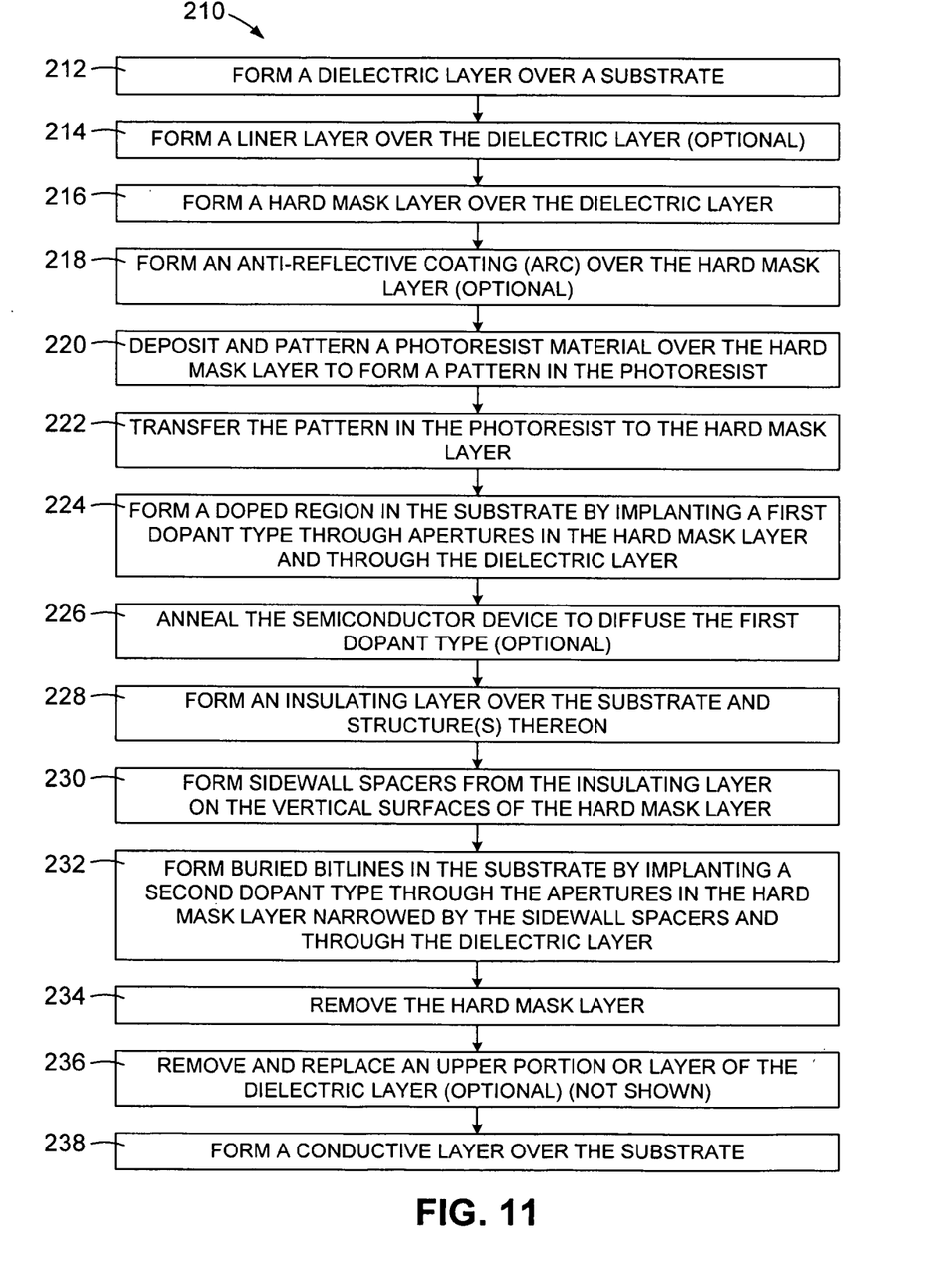
FIG. 11 is a flow chart highlighting the steps of the manufacturing process.

The steps of a method 210 for fabricating the semiconductor device 10 are outlined in the flow chart shown in FIG. 11. FIGS. 3–10 illustrate various steps of the method 210. It will be appreciated that the method 210 and the semiconductor device 10 described below are merely exemplary and that suitable embodiments of the many below described variations in materials, thicknesses and/or structures may alternatively be used in the method 210 and/or the semiconductor device 10.

Figure 3:
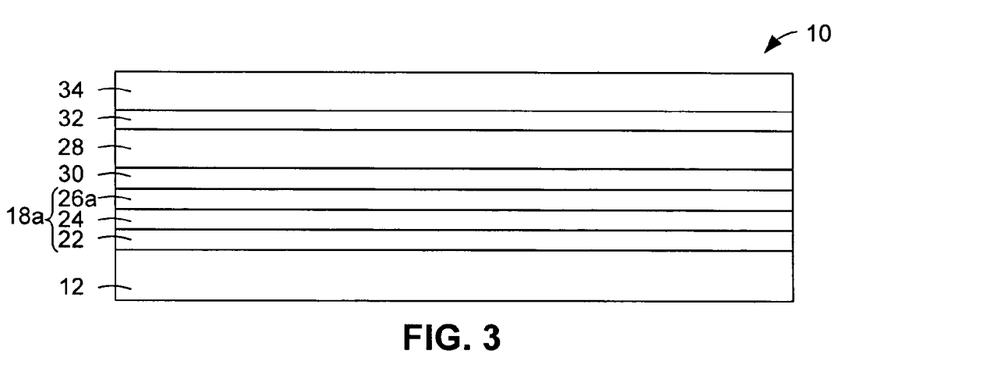
FIGS. 3–10 are schematic cross-sectional views of the semiconductor device at intermediate stages of manufacture in accordance with the present invention.

In Step 212, as represented in FIG. 3, a structure representing an intermediate step of the manufacturing process is shown. The method is initiated with the substrate 12. The substrate 12 may be any material over which the dielectric layer 18 may be formed.

The substrate 12 may be, for example, a semiconductor material or a composite semiconductor substrate, e.g., semiconductor-on-insulator (SOI), as further described below. A substrate of a semiconductor material (referred to herein as semiconductor substrate) may be a bulk substrate, a composite semiconductor substrate or the like. Further, the semiconductor substrate may be formed of silicon, germanium or the like; a compound semiconductor, such as, GaAs, InGaAs or the like.

The composite semiconductor substrate may be an (SOI), a silicon-on-insulator, a germanium-on-insulator (GOI) or the like. The composite semiconductor substrate may comprise a support substrate, an insulating layer formed on the support substrate and a surface semiconductor layer formed on the insulating layer. The support substrate may be of one of the materials described above.

The insulating layer may comprise sapphire, quartz, glass, plastic or the like. For example, the insulating layer may be silicon oxide ($Si_xO_y$). The insulating layer may be a nitride layer, for example, silicon oxynitride (SiON), silicon nitride (SiN) or the like. Alternatively, the insulating layer may also be an undoped polysilicon. Further, the insulating layer may be of a material, including a permittivity greater than a permittivity of silicon dioxide ($SiO_2$), i.e., about 3.9.

Permittivity, $\epsilon$, of a material reflects the ability of the material to be polarized by an electric field. The permittivity of a material is typically described as its permittivity normalized to the permittivity of a vacuum, $\epsilon_0$. Hence, the relative permittivity, referred to as a dielectric constant K, of a material is defined as:

$K = \epsilon/\epsilon_0$.

While silicon dioxide ($SiO_2$) (sometimes simply referred to as "oxide") has a dielectric constant of approximately 3.9, other materials have higher K values. For example, aluminum oxide ($Al_2O_3$) has a K of about 9 to about 10. Much higher K values of, for example, 20 or more, can be obtained with various transition metal oxides, including tantalum oxide ($Ta_2O_5$), hafnium oxide ($HfO_2$) and zirconium oxide ($ZrO_2$).

Using a dielectric material including a higher K, for example, for the gate dielectric, allows a high capacitance and an electrical equivalent thickness of a thinner silicon dioxide ($SiO_2$) gate dielectric layer to be achieved while maintaining or increasing the physical thickness of the gate dielectric. For example, an aluminum oxide ($Al_2O_3$) layer that includes a K of 9.6 and a physical thickness of 6.25 nm is substantially electrically equivalent to a silicon oxide ($SiO_2$) layer (K=3.9), including a physical thickness of 2.5 nm. Therefore, the gate dielectric can be made electrically thin while being formed of a physically thicker layer compared to a conventional $SiO_2$ gate dielectric layer.

Examples of dielectric materials having a high-K include the following: aluminum oxide ($Al_2O_3$), hafnium oxide ($HfO_2$), zirconium oxide ($Zr_xO_y$), titanium oxide (TiO), yttrium oxide (YO), zirconium silicate, hafnium silicate, lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$) or the like. Additionally, the insulating layer may comprise other binary and tertiary metal oxides and ferro electric material, including a dielectric constant greater than silicon dioxide ($SiO_2$).

The thickness of the insulating layer may be adjusted in consideration of the characteristics of a semiconductor device to be realized, the magnitude of the voltage to be applied when the realized semiconductor is used, and is, for example, about 10 nm to about 100 nm thick.

The surface semiconductor layer functions as an active layer for forming the semiconductor device 10. The surface semiconductor layer may be made of a semiconductor material, such as silicon, germanium or the like; or a compound semiconductor, such as germanium-silicon (GeSi), GaAs, InGaAs or the like, or mixtures thereof. The surface semiconductor layer may be in a single crystal, polycrystalline or nanocrystalline form.

The thickness of the surface semiconductor layer can be adjusted in consideration of the characteristics of the semiconductor device 10 to be realized. For example, the junction depth of the source and drain regions may be varied. The depth of the channel region within the surface semiconductor layer may also be varied. The surface semiconductor layer may be, for example, about 1 nm to about 100 nm thick.

For illustrative purposes, the substrate 12 is a semiconductor substrate of bulk silicon. The semiconductor substrate 12 includes an active region (not shown) extending from a surface of the semiconductor substrate 12 to a depth of about 3 nm.

Next, the dielectric layer 18a is formed over the semiconductor substrate 12. The dielectric layer 18a may be a single dielectric layer or a multi-layer dielectric layer. In one embodiment, the dielectric layer 18a may be a charge trapping dielectric layer comprising a tunneling layer 22, a charge trapping layer 24 and an insulating layer 26a. However, it should be understood by those having ordinary skill in the art that the charge trapping dielectric layer may comprise only two layers, e.g., the tunneling layer 22 and the charge trapping layer 24, as further described below.

The dielectric layer 18a may be of any material over which a hard mask layer 28 may be formed. The dielectric layer 18a may be formed of any dielectric material, for example, oxide material, such as, $SiO_2$ or $Si_xO_y$, or of a high-K dielectric material, as further described above.

In the embodiment where the dielectric layer 18a is a charge trapping dielectric layer (three sub-layers), the tunneling layer 22 is interposed between the charge trapping layer 24 and the semiconductor substrate 12. The charge trapping layer 24 is interposed between the insulating layer 26a and the tunneling layer 22. The insulating layer 26a is formed over the charge trapping layer 24.

The tunneling layer 22 and the insulating layer 26a may be of any dielectric material, e.g., $Si_xO_y$, or of a high-K dielectric material, as further described above. For example, one or both of the tunneling layer 22 and the insulating layer 26a may be silicon oxide ($Si_xO_y$). One or both of the tunneling layer 22 and the insulating layer 26a may be an undoped polysilicon. One or both of the tunneling layer 22 and the insulating layer 26a may be a silicon-rich silicon dioxide layer. One or both of the tunneling layer 22 and the insulating layer 26a may be a layer having a high permittivity. One or both of the tunneling layer 22 and the insulating layer 26a may be an oxygen-rich silicon dioxide layer. One or both of the tunneling layer 22 and the insulating layer 26a may be a nitrided oxide layer. It should be understood by those having ordinary skill in the art that one or more of the sub-layers of the dielectric layer 18a may be of the same material, for example, SiRN, with different compositions. One or both of the tunneling layer 22 and the insulating layer 26a may be a thermally grown oxide or a deposited oxide or high-k dielectric material(s). One or both of the tunneling layer 22 and the insulating layer 26 may include multiple layers of any of the above desired combinations of materials that achieve the desired device characteristics.

The charge trapping layer 24 may be of any material that is compatible with the first and second dielectric layers and is capable of storing a charge. The charge trapping layer 24 may be a nitride, e.g., silicon nitride (SiN), silicon oxynitride (SiON), silicon rich nitride (SiRN) or the like. The charge trapping layer 24 may also be a nitrogen-rich silicon nitride layer.

In one embodiment, the three sub-layers 22, 24 and 26a form an oxide-nitride-oxide dielectric layer, commonly referred to as an ONO layer or an ONO dielectric layer. When the dielectric layer 18a acts as a charge trapping dielectric, the electron trapping is performed in the charge trapping layer 24. In this case, the dielectric layer 18a may be any dielectric layer or layers that are capable of or facilitate electron trapping. For example, the charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric or the like (in each case, the first layer mentioned is the bottom layer while the last layer mentioned is the top layer).

The dielectric layer 18a may have an overall thickness of between, for example, about less than 1 nm and about 500 nm. In one embodiment, the dielectric layer 18a may have a thickness of, for example, between about 10 nm and about 300 nm. In another embodiment, the dielectric layer 18a may have a thickness of, for example, between about 50 nm and about 250 nm. It should be understood by those having ordinary skill in the art that the above thickness ranges are merely exemplary and that the exemplary thicknesses ranges may be recombined, for example, from about 1 nm to about 300 nm, or about 10 nm to about 250 nm, or about 1 nm to about 10 nm or the like. Each sub-layer will be deposited to a thickness according to a desired device parameter for a semiconductor device 110 to be realized as further described below.

With regards to the overall thicknesses of the dielectric layer 18a described above, in one embodiment the tunneling layer 22 and the insulating layer 26a individually have thicknesses from about 0.2 nm to about 15 nm while the charge trapping layer 24 has a thickness from about 0.5 nm to about 15 nm. In another embodiment, the tunneling layer 22 and the insulating layer 26a individually have thicknesses from about 5 nm to about 12 nm while the charge trapping layer 24 has a thickness from about 3 nm to about 13 nm. In another embodiment, the tunneling layer 22 may have a thickness different than the insulating layer 26a.

For illustrative purposes, the dielectric layer 18a is a charge trapping dielectric layer formed over the semiconductor substrate 12. The charge trapping dielectric layer includes the tunneling layer 22, the charge trapping layer 24 and the insulating layer 26a. The tunneling layer 22 and the insulating layer 26a are of silicon dioxide. The charge trapping layer 24 is of silicon nitride. The tunneling layer, the insulating layer 26a and the charge trapping layer each have a thickness of about 5 nm.

Although the term non-volatile memory device is often used herein, it is to be understood that a non-volatile memory device as used herein may contain any of the charge trapping dielectrics described herein. In other words, a non-volatile memory device contains any dielectric layer or layers that are capable of or facilitate electron trapping, and the non-volatile memory device contains an ONO charge trapping dielectric only when a specific reference to such dielectric is indicated.

Continuing to refer to FIG. 3, in Step 214 (optional), a liner layer 30 is formed over the dielectric layer 18a. The liner layer 30 functions as an etch stop layer. Accordingly, the liner layer 30 may be of any material over which the hard mask layer 28 may be formed and which can be used to stop an etch process of the hard mask layer 28. The liner layer 30 may be thermally grown. Alternatively, the liner layer 30 may be deposited using conventional techniques. The liner layer 30 may have a thickness of, for example, between about 1 nm to about 50 nm.

The liner layer 30 may be a silicon oxide ($Si_xO_y$). Additionally, the liner layer 30 may be a nitride layer, for example, silicon oxynitride (SiON), silicon nitride (SiN) or the like.

Next, in Step 216, the hard mask layer 28 to be patterned is formed over the dielectric layer 18a (over the liner layer 30, if the liner layer 30 is formed); again using conventional techniques. For example, the hard mask layer 28 may be thermally grown. Alternatively, the hard mask layer 28 may be deposited using conventional techniques. Further, the hard mask layer 28 may be formed using a combination of the above, e.g., a thin oxide layer may be thermally grown to form a good interface and then an oxide of lesser quality may be deposited thereon.

The hard mask layer 28 may be of any known mask material on which a photosensitive imaging layer can be coated and patterned by conventional lithographic techniques. The hard mask layer 28 may be, for example, silicon oxide ($Si_xO_y$). Additionally, the hard mask layer 28 may be a nitride layer, for example, silicon oxynitride (SiON), silicon nitride (SiN) or the like. In an embodiment, the hard mask layer 28 may be silicon carbide (SiC) an organic matrix or inorganic matrix. In an embodiment, the hard mask layer 28 may be an amorphous carbon.

The hard mask layer 28 may have a thickness of, for example, between about 50 nm to about 150 nm. In one embodiment, the hard mask layer 28 may have a thickness of, for example, between about 1 nm and about 300 nm. In another embodiment, the hard mask layer 28 may have a thickness of, for example, between about 5 nm and about 250 nm. It will be understood by those having ordinary skill in the art that the above thickness ranges of the hard mask layer 28 are merely exemplary and that the thickness ranges may be recombined, for example, from about 1 nm to about 150 nm, or about 50 nm to about 250 nm, or about 1 nm to about 5 nm or the like.

Next, in Step 218 (optional), an anti-reflective coating (ARC) 32 of silicon rich nitride (SiRN) is formed on the hard mask layer 28. Other exemplary materials which may be used as the ARC 32 include a SiON, a silicon rich oxide (SiRO), a SiC, or a disposable organic ARC or the like. The ARC 32 has a thickness of about 10 nm, for illustrative purposes. The ARC 32 is deposited by spin-coating.

As indicated above, the ARC 32 is optional. However, the ARC 32 is used when increased resolution of the lithography process is required.

Next in Step 220, an imaging layer 34 of a photosensitive material is applied, for example, by spin-coating. The imaging layer 34 may have a thickness in the range of about 20 nm to about 800 nm, for example. Then, the imaging layer 34 is patterned by pattern-exposing using a conventional lithographic tool, developed, rinsed and dried. Next, developer solution is applied to form a line and space pattern in the imaging layer 34 according to the pattern (not shown).

The lines in the photosensitive material have sidewalls, including a vertical component. The width dimension of the lines is determined by the characteristics of the device being formed. In one embodiment, the width dimension of the lines is the smallest image dimension that is obtainable by the conventional lithography process utilized in Step 220 above. For example, the width may be the smallest dimension that is achievable by pushing known lithography (which includes x-ray, electron-beam, etc.) to its highest resolution limit. Next, the imaging layer 34 may be subjected to a hardening process to thermally stabilize the imaging layer 34. Deep ultraviolet exposure or heat treatment at a temperature of about 200° C. to about 250° C. for about 1–2 minutes may be used for hardening. Another method of hardening the imaging layer 34 is by subjecting it to a halogen gas plasma. This hardening step is optional and may be needed for conventional photoresists, lest the photosensitive material constituting the imaging layer 34 may melt and flow or otherwise get degraded during the subsequent process.

Next in Step 222, an anisotropic etching is conducted to transfer the lithographic image (the pattern in the photoresist) from the imaging layer 34 to the ARC 32, if used, and the hard mask layer 28. A patterned hard mask layer 28a, alone or in combination with the patterned ARC (not shown), may be generally referred to as the "hard mask". The etchant removes the exposed ARC 32 and the underlying hard mask layer 28 in the openings (apertures) 36 of the photosensitive material leaving a line 38 in the hard mask, including a dimension substantially similar to the dimension of a line in the photosensitive material. The lines 38 have sidewalls 40, including a vertical component. A subsequent cleaning or etching removes any remaining imaging layer 34 (not shown). Thus, the smallest image size that is obtainable at the resolution limit of lithography in Step 220 above is transferred from the patterned imaging layer to the hard mask (generally designated 28a). The resultant structure is illustrated in FIG. 4.

Figure 4:
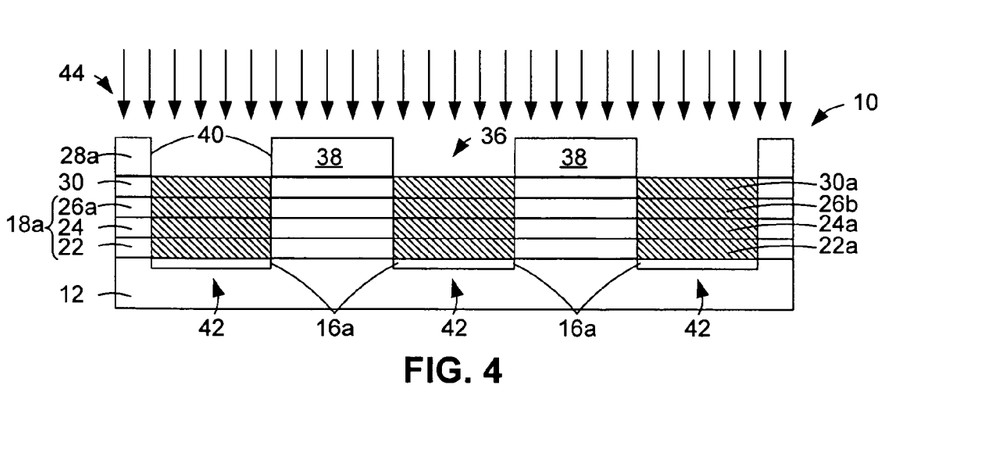

In Steps 224, 226, 228, 230 and 232, as illustrated in FIGS. 4–8, buried bitlines 14 with adjacent doped regions 16 are formed. Initial doping of a surface region 42 of the semiconductor substrate 12 underlying the apertures 36 in the hard mask 28a may be accomplished by implanting conductivity type impurities (first dopant type 44) into the surface region 42 of semiconductor substrate 12 through the liner layer 30, if used, and the dielectric layer 18a. The patterned hard mask layer 28a overlaying the remaining portions of the semiconductor substrate 12 inhibits the implanting of the conductivity type impurities into the active region of the remaining portions of the semiconductor substrate 12. Thus, a doped region 16a is formed in the surface region 42 of the semiconductor substrate 12 as shown in FIG. 4.

Portions of the intervening layers, e.g., the dielectric layer 18a and the liner layer 30, if used, may be damaged during the implantation of the doped region 16a. Damaged portions of the tunneling layer 22, the charge trapping layer 24, the insulating layer 26a and the liner layer 30 are illustrated in FIG. 4 with a cross hatch and labeled, 22a, 24a, 26b and 30a, respectively.

Figure 5:
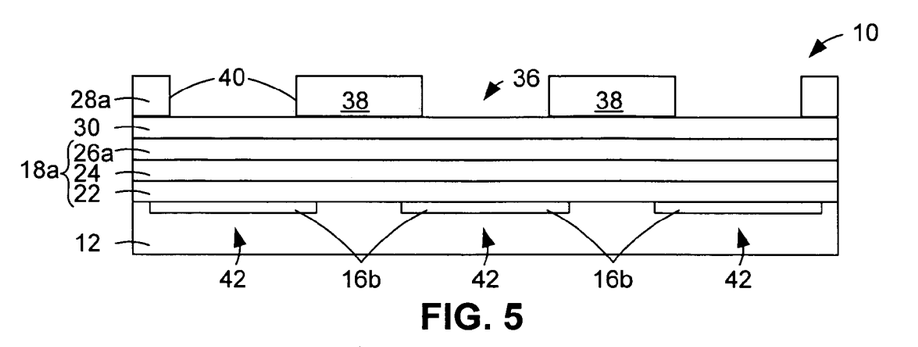

Next in Step 226, as represented in FIG. 5, an annealing process (optional) is conducted wherein the first dopant type 44 laterally diffuses and forms doped regions 16b (FIG. 5). Additionally, the annealing process may repair the damage to the portions of the damaged dielectric layer 18a and the liner layer 30, if used, damaged by the implant process.

Figure 6:
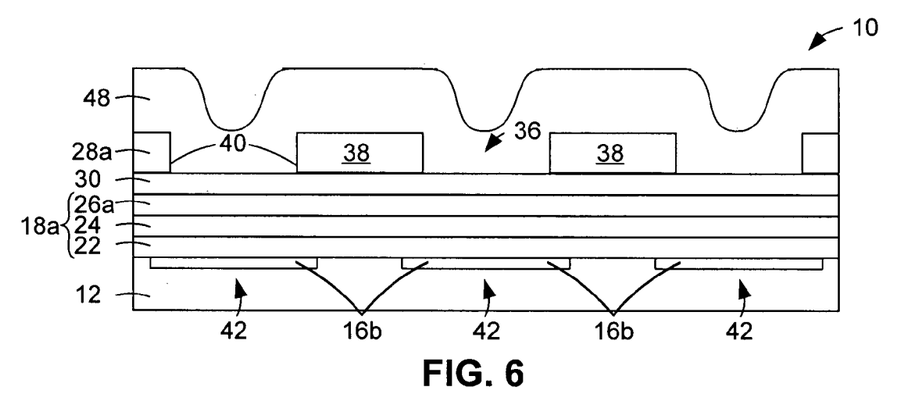
Figure 7:
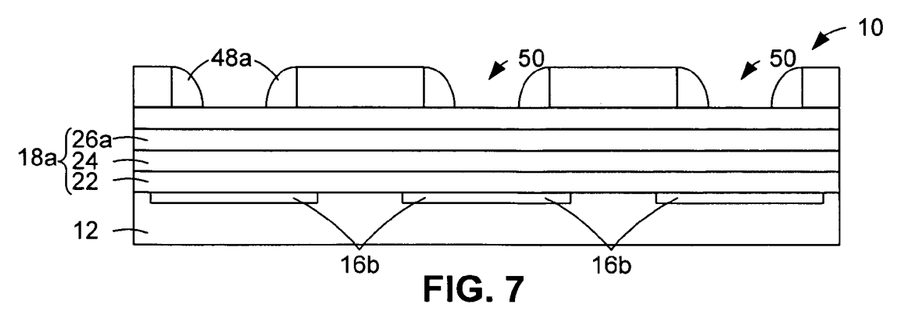

Next in Step 228 and Step 230, as illustrated in FIGS. 6–7, sidewall spacers 48a are formed in the apertures 36 of the patterned hard mask layer 28a (FIG. 7). According to one method, a second insulating layer 48 is formed over the patterned hard mask layer 28a and the portion of the dielectric layer 18a (or over the liner layer 30, if used) exposed by the openings 36 therein as represented in FIG. 6. In general, the second insulating layer 48 may be any material that can be deposited on the patterned hard mask layer 28a.

Examples of material of the second insulating layer 48 include, for example, silicon oxide ($Si_xO_y$) deposited from tetraethylorthosilicate (TEOS) or Silane, LPCVD or PECVD. Alternatively, the second insulating layer 48 may be a SiRO. Additionally, the second insulating layer 48 may be a nitride layer, for example, SiON, SiN, SiRN or the like or a low k dielectric, for example, $Si_xO_y$ containing F, C, or H, with different latice geometries. The second insulating layer 48 may be polysilicon, amorphous silicon or the like, or a combination thereof.

In a particular embodiment, the second insulating layer 48 may be of the same material as the hard mask layer 28 including a different composition which decreases the etch rate of the second insulating layer material significantly with regards to the etch rate of the hard mask layer 28. In other words, an etchant may be used which is selective between the materials such that the etch rate of the second insulating layer material is significantly less than the etch rate of the hard mask layer 28. Thus, sidewall spacers 48a will remain on the sidewalls 40 of the apertures 36 of the patterned hard mask layer 28a.

An example material for the second insulating layer 48 is $Si_xO_y$ obtained by hexamethyldisilazane (HMDS) deposition. Typically, the second insulating layer 48 is formed by mounting the semiconductor substrate 12, including the structure of FIG. 5, in a plasma deposition system. Then, liquid HMDS is introduced into the process chamber and the necessary electric field is generated therein, which transforms the liquid HMDS into a HMDS plasma. The HMDS plasma will deposit on the structure of FIG. 5 obtaining a uniform conformal layer of plasma-deposited HMDS including the composition $Si_xO_y$.

The thickness of the conformal layer, i.e., the second insulating layer 48 (also referred to herein as conformal layer 48) is determined by the desired width of a bitline to be formed in the semiconductor substrate 12. Typically, for very large scale integrated circuit fabrication, the thickness of the conformal layer 48 is in the range of about 5 nm to about 100 nm. The lower limit of the thickness of the conformal layer 48 is dictated by the requirements of good step coverage associated with the vertical wall profile of a line 38 of the hard mask 28*a* and viability of the conformal layer 48 as a thin film useful as a mask. The upper limit for the thickness of the conformal layer 48 is determined by the desired percentage reduction in the size of the width of the bitline 14 to be produced in the semiconductor substrate 12.

In other words, if the size of the opening 36 is 15 nm, in order to achieve a bitline 14 including a width of 5 nm, a 5 nm wide HMDS or other conformal layer is deposited. Next, the conformal layer 48 is anisotropically etched to remove it from all the substantially horizontal surfaces leaving it only on the sidewalls 40 of the lines 38 of the hard mask 28*a*.

The unetched portions of the conformal layer 48 now serve as sidewall spacers 48*a* on the sidewalls 40 of the hard mask 28*a*. Accordingly, the dimension of the aperture 36 has been reduced to a dimension which includes the target dimension for the bitline 14 to be formed in the semiconductor substrate 12, i.e., a width dimension less than achievable at a resolution limit of lithography. The sidewall spacers 48*a* are used as a new mask to form a narrow bitline(s) 14 in the semiconductor substrate 12 of a width less than achievable at a resolution limit of lithography. That is, the bitline implant is implanted through the narrower openings 50 to produce narrower bitlines 14. Once the intended use of the new mask is complete, it may be removed from the semiconductor substrate 12 by subjecting the hard mask 28*a* and the sidewall spacers 48*a* to a suitable etchant, for example, a hot oxidizing acid such as nitric acid, sulphuric acid, hot phosphoric acid or a hot phenol. Alternatively, the hard mask 28*a* and the sidewall spacers 48*a* may be removed concurrently by oxygen plasma. Any the hard mask 28*a* or sidewall spacers 48*a* that remain may be removed by mechanical means, a plasma etch or washed off in a liquid base.

Figure 8:
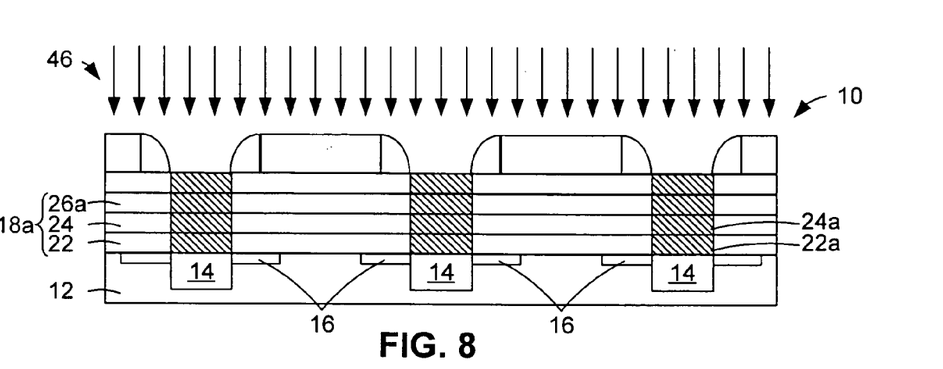

For illustrative purposes, with reference to FIG. 8, the second insulating layer 48 is etched using, for example, a directional reactive ion etching (RIE). The second insulating layer 48 is removed from all the horizontal surfaces of the hard mask 28*a* and sidewall spacers 48*a* are left in the corresponding openings 36 in the hard mask 28*a*.

Next in Step 232, as illustrated in FIG. 8, additional doping of the surface region 42 of the semiconductor substrate 12 with conductivity type impurities (second dopant type 46) opposite the first dopant type 38 is conducted to form the buried bitlines 14, i.e., the source and drain of the semiconductor device 10.

As is understood by those skilled in the art, the semiconductor device 10 may be an N-type device or a P-type device. That is, an N-type device has bitlines with N-type impurities and a channel region with P-type impurities. A P-type device has bitlines with P-type impurities and a channel with N-type impurities. In the case where the conductivity type impurity is a P-type impurity, boron, $BF_2$, aluminum, gallium, indium or the like is used, and gallium or indium is preferably used because it has a low diffusion coefficient. On the other hand, in the case where the conductivity type impurity is an N-type impurity, phosphorous, antimony (Sb) or arsenic is used.

In this respect, with reference to FIG. 5, in the case where the surface region 42 of the semiconductor substrate 12 is doped with the first conductivity type impurities, the surface region 42 of the semiconductor substrate 12 underlying the apertures 36 of the patterned hard mask layer 28*a* may be doped in a uniform impurity concentration with the first conductivity type impurities, or the surface may be doped with the first conductivity type impurities in such a way that the impurity concentration is lower in the surface thereof than in the other part thereof, or the whole surface semiconductor layer may be doped in a uniform impurity concentration with the first conductivity type impurities and then may be doped with second conductivity type impurities to reduce the first conductivity type impurity concentration. Alternatively, the first conductivity type impurities may be implanted at an angle relative to the semiconductor substrate 12, i.e., a tilt implant may be performed. The tilt implant will implant a higher concentration of the first conductivity type impurities near and/or under a line concurrent with the respective edges of the apertures 36 and a lower concentration or no impurities therebetween.

In the case where the whole surface semiconductor layer is doped in a uniform impurity concentration with the first conductivity type impurities, it is preferable that the concentration of the first conductivity type impurity is about $1 \times 10^{17}$ atoms/cm$^3$ to about $1 \times 10^{20}$ atoms/cm$^3$. On the other hand, in the case where the impurity concentration is lowered in the surface thereof, it is preferable that the concentration of the first conductivity type impurity in the surface thereof is about $1 \times 10^{15}$ atoms/cm$^3$ to about $1 \times 10^{18}$ atoms/cm$^3$. The depths of the doped regions of the first dopant type can be adjusted according to the thickness of the active layer.

With reference to FIG. 8, the surface region 42 of the semiconductor substrate 12 is doped with a second conductivity type impurities (the second dopant type 46), the surface region 42 of the semiconductor substrate underlying the apertures 36 of the hard mask 28*a* may be doped in a uniform impurity concentration with the second conductivity type impurities, or the surface region 42 may be doped with the second conductivity type impurities in such a way that the impurity concentration is lower in an upper region (not shown) of the surface region 42 thereof than in the remaining part thereof, or the whole surface region 42 of the semiconductor substrate 12 may be doped in a uniform impurity concentration with the second conductivity type impurities and then may be doped with third conductivity type impurities to reduce the second conductivity type impurity concentration.

Portions of the dielectric layer 18*a* and the liner layer 30, if used, may be damaged during the implantation of the buried bitlines 14. Damaged portions of the tunneling layer 22, the charge trapping layer 24, the insulating layer 26*a* and the liner layer 30 are illustrated in FIG. 8 with a cross hatch and labeled 22*b*, 24*b*, 26*c* and 30*b*, respectively.

For example, in the case where phosphorous is used, the method is used in which phosphorous ions are implanted at an accelerated energy of about 1 keV to about 100 keV and at a dose of about $1 \times 10^{14}$ atoms/cm$^2$ to about $1 \times 10^{16}$ atoms/cm$^2$, thereby finally making an impurity concentration of about $1 \times 10^{19}$ atoms/cm$^3$ to about $1 \times 10^{21}$ atoms/cm$^3$. Thus, the forming of the buried bitlines 14 results in the formation of the doped regions 16 adjacent the buried bitlines 14.

Figure 9:
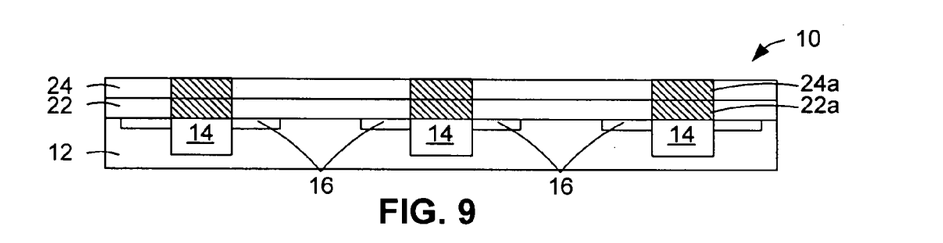

Next, in Step 234, with reference to FIG. 9, the patterned hard mask layer 28*a* and the sidewall spacers 48*a* are removed. The patterned hard mask layer 28*a* may be removed by another RIE. The RIE etchant used may be, for example, the same etchant species that facilitated removal of the hard mask layer 28 in Step 222 above. The sidewall spacers 48a may be removed by another RIE. However, the etchant species must have a selectivity between patterned hard mask layer 28a and the sidewall spacers 48a and the insulating layer 26a such as described above. The exposed liner layer 30, if formed, may be removed by another RIE if desired. Alternatively, the etchant used may be an $O_2$ plasma, an argon plasma, a fluorine plasma or the like.

Next, in Step 236, as illustrated in FIG. 10, the insulating layer 26a is removed. The insulating layer 26a may be removed by another RIE. The RIE etchant used may be, for example, the same etchant species that facilitated removal of the hard mask layer 28a in Step 234 above. However, the etchant species must have a selectivity between the insulating layer 26a and the charge trapping layer 24 such as described above. Next, the insulating layer 26 is formed over the charge trapping layer 24. The insulating layer 26 may be formed of a material and of the dimensions described above in relation to the insulating layer 26a. Thus, the insulating layer 26 (undamaged) is formed over the charge trapping layer 24. Alternatively, an annealing process, as described above, may be performed to repair the damage to the portions of the dielectric layer 18a caused by the implantation of impurities to form the buried bitlines 14.

Next, in Step 238, as illustrated in FIG. 1, the conductive layer 20 is formed and patterned to form wordlines. The conductive layer 20 can be formed of doped or undoped polysilicon, ruthenium, platinum, iridium, silicide of a metal including a high melting point such as W, Ta, Ti, Mo, Ni or the like; polycide made of the silicide (for example, $MoSi_2$ and $WSi_2$) and polysilicon; and the other metals. Alternatively, the conductive layer 20 may be porous, amorphous, single crystal, polycrystalline, nanocrystalline or the like, or combinations thereof. The conductive layer 20 may be, for example, about 5 nm thick.

In one embodiment, the conductive layer 20 may have a thickness of, for example, between about less than 1 nm and about 1000 nm. In another embodiment, the conductive layer 20 may have a thickness of, for example, between about 10 nm and about 500 nm. It should be understood by those having ordinary skill in the art that the above thicknesses are merely exemplary and that the thicknesses may be combined, for example, from about less than 1 nm to about 500 nm, or about 10 nm to about 1000 nm, or about less than 1 nm to about 10 nm or the like.

The conductive layer 20 is applied over the substrate 12 and/or the dielectric layer 18 using known techniques, such as spin-coating, chemical vapor deposition (CVD), plasma enhanced chemical vapor deposition (PECVD), atomic layer deposition (ALD) or the like. For exemplary purposes, the conductive layer 20 is of a polysilicon. The polysilicon may be deposited over the semiconductor substrate 12 using a PECVD process.

Next, the semiconductor device 10 may be completed using conventional techniques known by those having ordinary skill in the art (not shown). For example, if the sidewalls of the non-volatile memory device are exposed, a spacer may be formed on a sidewall of non-volatile memory cell. The spacer may be of an insulating film in consideration of the diffusion of the impurities in the lateral direction during the formation of the source and drain regions. Additionally, the semiconductor device 10, may be further isolated from other devices on the semiconductor substrate by a LOCal Oxidation of Silicon (LOCOS) oxide film or a trench device isolation film (shallow trench isolation, i.e., STI). Further, contacts may be formed on the non-volatile memory cell and the source and drain regions, or the like, to complete a working semiconductor device 10.

Figure 12:
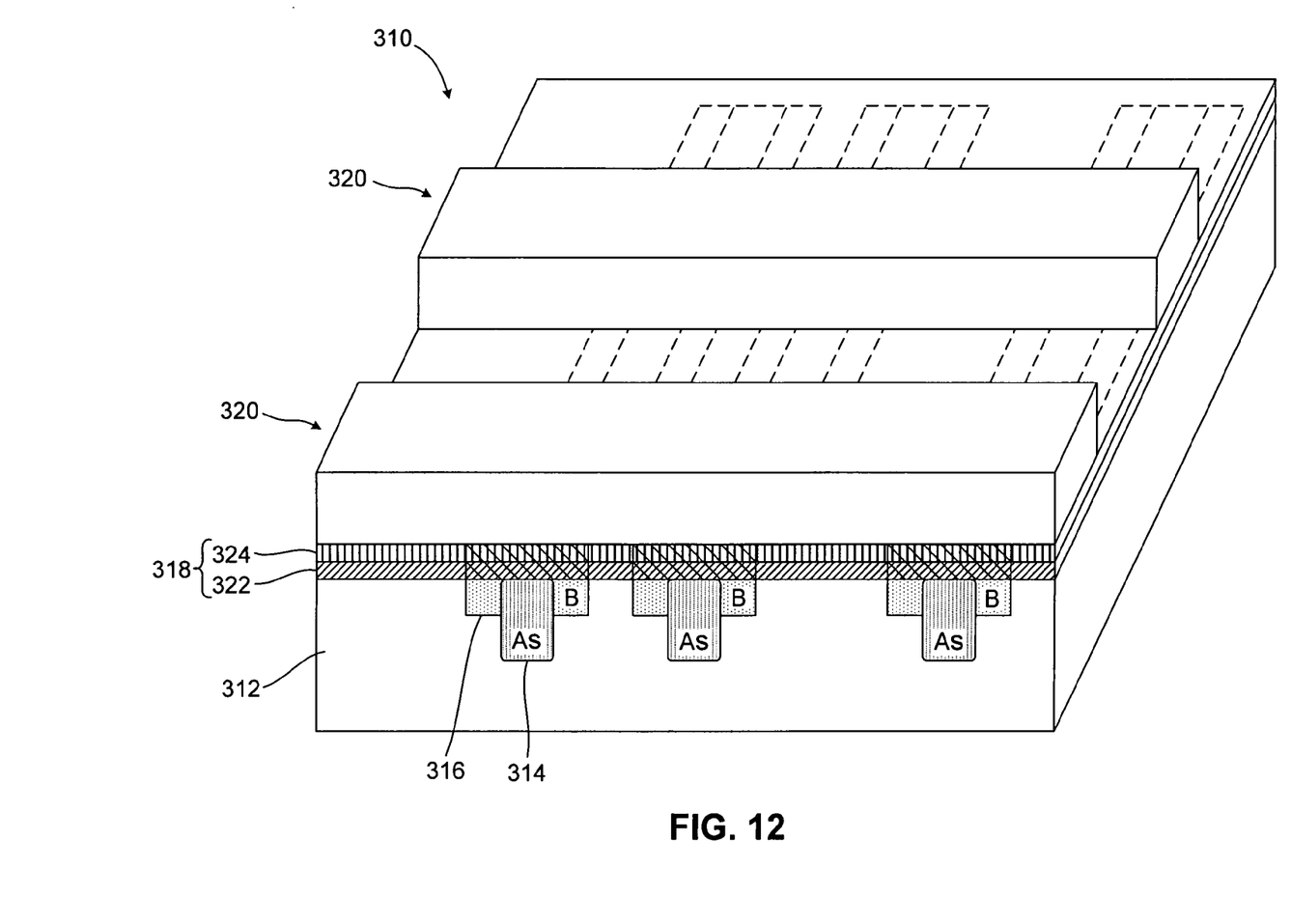
FIG. 12 illustrates a perspective view of another embodiment of the semiconductor device in accordance with the present invention.

In one embodiment, as illustrated in FIG. 12, a semiconductor device 310 includes a semiconductor substrate 312 including buried bitlines 314 and adjacent doped regions 316. The semiconductor device 310 also includes a dielectric layer 318 formed over the semiconductor substrate 312. The dielectric layer 318 includes a tunneling layer 322 and a charge trapping layer 324. The tunneling layer 322 is interposed between the semiconductor substrate 312 and the charge trapping layer 324. A conductive layer 320 is formed over the charge trapping layer 324. In one embodiment, the semiconductor device 310 includes isolation structures (not shown) interposed between the dielectric layer 318 and the conductive layer 320 to partially isolate the memory cells.

Figure 13:
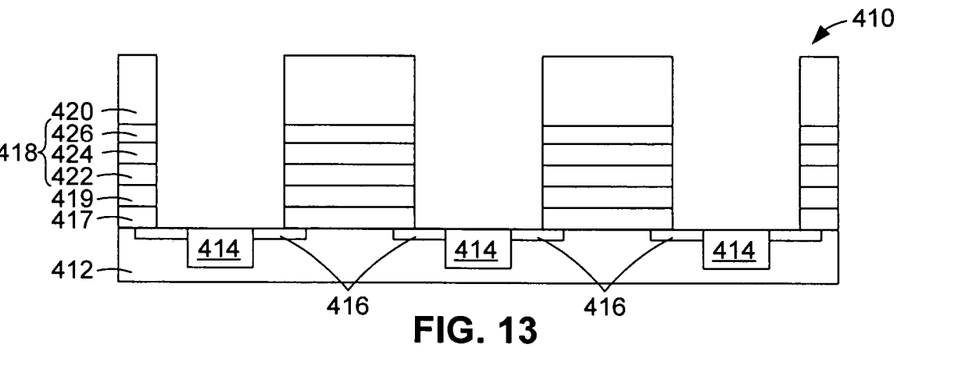
FIG. 13 is a schematic cross-sectional view of another embodiment of the semiconductor device in accordance with the present invention.

Now referring to FIG. 13, another example of a device, which may take advantage of doped regions adjacent buried bitlines, is a floating gate FLASH memory device 410. In one embodiment of the floating gate FLASH memory device 410, a semiconductor substrate 412 is provided. Buried bitlines 414 are formed in the semiconductor substrate 412. Doped regions 416 are formed adjacent the buried bitlines 414. A gate dielectric layer 417 is formed over the semiconductor substrate 412. A second conductive layer 419 is formed over the gate dielectric layer 417. A dielectric layer 418 is formed over the semiconductor substrate 412. A conductive layer 420 is formed over the dielectric layer 418.

In this embodiment, the second conductive layer 419 functions as the charge trapping layer. Additionally, the dielectric layer 418 functions as an intergate dielectric layer. The dielectric layer 418 may comprise a single layer or multiple layers, such as the illustrated layers 422, 424 and 426. Further, the dielectric layer 418 may be of conventional dielectric material or of a high-K material as further described above. The dielectric layer 418 may have a thickness of between about 1 nm and about 500 nm.

In one embodiment, the dielectric layer 418 may have a thickness of, for example, between about 10 nm and about 300 nm. In another embodiment, the dielectric layer 418 may have a thickness of, for example, between about 50 nm and about 250 nm. It should be understood by those having ordinary skill in the art that the above thickness ranges are merely exemplary and that the thickness ranges may be recombined, for example, from about 1 nm to about 300 nm, or about 10 nm to about 250 nm, or about 1 nm to about 10 nm or the like.

In accordance with the present invention, the buried bitlines for such a device may be further scaled. Such a FLASH memory cell would be capable of operating at significantly higher speeds than traditional FLASH memory cell devices formed by conventional methods. Additionally, the scaling of the FLASH memory cell would allow a higher yield per wafer.

While the invention has been explained in relation to its preferred embodiments, it is to be understood that various modifications will become apparent to those skilled in the art upon reading the specification. It will further be appreciated that the semiconductor device 10 may alternatively have other shapes than the shapes shown in FIGS. 2, 12, and 13, for example. Therefore, it is to be understood that the invention disclosed herein is intended to cover such modifications as fall within the scope of the appended claims. Additionally, although the flow chart 210 of FIG. 11 shows a specific procedural order, it is understood that the procedural order may differ from that which is depicted. For example, the procedural order of two or more blocks may be reordered relative to the order shown. Also, two or more blocks shown in succession in FIG. 11 may be executed concurrently or with partial concurrence.

INDUSTRIAL APPLICABILITY

One aspect of the present invention involves the formation of the doped region 16 adjacent to the buried bitline 14. The adjacent doped region is typically formed of a dopant type opposite that of the buried bitline species. As a result, undesirable charge distribution from charges flowing in the channel are thereby avoided. Additionally, the punch-through protection from undesirable charges flowing through the channel region between the buried bitlines 14 is significantly increased. Further still, ONO scaling due to implant damage in the ONO layers above the bitline implantation regions is avoided, i.e., the damaged ONO does not couple to the wordline. Further, the number of manufacturing steps to produce such devices is reduced. Further still, the dimensions of the bitlines and/or the doped regions adjacent the buried bitlines are formed with more precision thereby increasing the punch-through protection. In one embodiment, the programmable location in the ONO is confined to a region defined by an interface of the charge trapping layer and the wordlines for program and erase.

What is claimed is:

1. A method of manufacturing a semiconductor device, the method comprising the steps of:
   forming a charge trapping layer over a substrate;
   forming a hard mask with openings of a width dimension less than achievable at a resolution limit of lithography including:
      forming a hard mask layer over the charge trapping layer;
      depositing and patterning a photoresist layer over the hard mask layer to form a pattern in the photoresist; and
      transferring the pattern from the photoresist to the hard mask layer;
   forming buried bitlines in the substrate; and
   forming a doped region adjacent at least one of the buried bitlines,
   wherein the doped region adjacent the at least one of the buried bitlines inhibits a leakage current between the buried bitlines, and
   wherein forming the doped region and the buried bitlines respectively include:
      implanting the substrate through apertures in the hard mask to form the doped region adjacent the at least one of the buried bitlines with a first dopant type; and
      implanting the substrate through the apertures in the hard mask to form the buried bitlines of a second dopant type opposite the first dopant type.

2. The method according to claim 1, further including the step of:
   defining at least two regions in the charge trapping layer for programming and erasing the semiconductor device.

3. The method according to claim 1, further including the step of:
   forming a conductive layer over the charge trapping layer, wherein the charge trapping layer is interposed between the substrate and the conductive layer.

4. The method according to claim 1, wherein the charge trapping layer is a multi-layer dielectric layer.

5. The method according to claim 4, wherein the multi-layer dielectric layer includes a charge trapping dielectric layer.

6. The method according to claim 5, wherein the multi-layer dielectric layer is an oxide-nitride-oxide (ONO) layer.

7. The method according to claim 1, wherein the charge trapping layer includes:
   a tunneling layer;
   a charge trapping dielectric layer; and
   an insulating layer;
   wherein the tunneling layer is disposed over the substrate, the charge trapping dielectric layer is disposed over the tunneling layer and the insulating layer is disposed over the charge trapping dielectric layer.

8. The method according to claim 7, wherein a material of the tunneling layer is one or more of a $SiO_2$ or an oxynitride.

9. The method according to claim 8, wherein the charge trapping layer includes one or more materials of a permittivity greater than $SiO_2$.

10. The method according to claim 9, wherein the high permittivity material is one or more of, silicon nitride ($Si_xN_y$), silicon oxynitride ($SiO_xN_y$), aluminum oxide ($Al_2O_3$), hafnium oxide (HfO), zirconium oxide (ZrO), titanium oxide (TiO), yttrium oxide (YO), zirconium silicate, hafnium silicate, lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), or PMN ($PbMg_xNb_{1-x}O_3$).

11. The method according to claim 1, further including the steps of:
   forming an insulating layer over the hard mask layer, and
   removing the insulating layer from the horizontal surfaces of the hard mask layer.

12. The method according to claim 11, further including the step of:
   removing the hard mask layer.

13. The method according to claim 1, wherein the first dopant type is boron and the second dopant type is arsenic.

14. The method according to claim 1, further including the step of:
   annealing the semiconductor device to repair damage in the charge trapping layer due to the implanting of the first dopant type.

15. The method according to claim 1, wherein the charge trapping layer is a conducting layer.

16. The method according to claim 1, further including the step of:
   forming a control gate over the charge trapping layer.

17. The method according to claim 16, further including the step of:
   forming a multi-layer dielectric layer over the charge trapping layer,
   wherein the multi-layer dielectric layer is interposed between the charge trapping layer and the control gate.

* * * * *